United States Patent
Wang et al.

(10) Patent No.: US 7,227,437 B2
(45) Date of Patent: Jun. 5, 2007

(54) HIGH FIELD OPEN MRI MAGNET ISOLATION SYSTEM AND METHOD

(75) Inventors: Yu Wang, Clifton Park, NY (US); Evangelos Trifon Laskaris, Niskayuna, NY (US); Richard Andrew Ranze, Scotia, NY (US)

(73) Assignee: General Electric Company, Schenectady, NY (US)

( * ) Notice: Subject to any disclaimer, the term of this patent is extended or adjusted under 35 U.S.C. 154(b) by 341 days.

(21) Appl. No.: 10/390,745

(22) Filed: Mar. 19, 2003

(65) Prior Publication Data

US 2003/0174036 A1    Sep. 18, 2003

Related U.S. Application Data

(63) Continuation of application No. 09/682,519, filed on Sep. 13, 2001.

(51) Int. Cl.
*H01F 6/00* (2006.01)
*G01V 3/00* (2006.01)

(52) U.S. Cl. .................. 335/216; 324/318; 324/319

(58) Field of Classification Search ............... 335/216, 335/296–306; 324/318–322
See application file for complete search history.

(56) References Cited

U.S. PATENT DOCUMENTS

| | | | |
|---|---|---|---|
| 3,582,027 A | 6/1971 | Hackbarth et al. | |
| 3,589,655 A | 6/1971 | Hackbarth et al. | |
| 3,836,134 A | 9/1974 | Lowe | |
| 4,571,586 A | 2/1986 | Right | |
| 4,591,790 A | 5/1986 | Takahashi | |
| 4,766,378 A | 8/1988 | Danby et al. | |
| 4,781,363 A | 11/1988 | Braun | |
| 5,016,638 A * | 5/1991 | Hsieh | 600/410 |
| 5,332,969 A | 7/1994 | Tsuruno et al. | |
| 5,412,363 A * | 5/1995 | Breneman et al. | 335/216 |
| 5,573,220 A | 11/1996 | Whittaker et al. | |
| 5,765,800 A | 6/1998 | Watanabe et al. | |
| 5,793,210 A | 8/1998 | Pla et al. | |
| 5,812,420 A | 9/1998 | Takahashi | |
| 5,861,574 A | 1/1999 | Kotani et al. | |
| 5,876,012 A | 3/1999 | Haga et al. | |

(Continued)

FOREIGN PATENT DOCUMENTS

EP    1 085 336 A2    3/2001
EP    1 231 477 A1    8/2002

OTHER PUBLICATIONS

Website:www.techmfg.com, page entitled: "Stacis 3000—Active Piezoelectric Vibration Control System (OEM)," Aug. 16, 2001.

(Continued)

*Primary Examiner*—Ramon M. Barrera
(74) *Attorney, Agent, or Firm*—Foley and Lardner LLP

(57) ABSTRACT

A vertically-aligned open MRI magnet system includes first and second (i.e., top and bottom) assemblies each having a longitudinally-extending and vertically-aligned axis, a superconductive main coil, and a vacuum enclosure enclosing the main coil. At least one support beam has a first end attached to the first assembly and has a second end attached to the second assembly. A vibration isolation system supports the magnet system.

32 Claims, 4 Drawing Sheets

U.S. PATENT DOCUMENTS

| | | |
|---|---|---|
| 5,881,987 A | 3/1999 | Hara |
| 5,996,960 A | 12/1999 | Krajec |
| 6,036,162 A | 3/2000 | Hayashi |
| 6,043,653 A | 3/2000 | Takamori et al. |
| 6,160,399 A | 12/2000 | Radziun et al. |
| 6,169,404 B1 | 1/2001 | Eckels |
| 6,181,228 B1 | 1/2001 | Laskaris et al. |
| 6,198,371 B1 | 3/2001 | Laskaris et al. |
| 6,202,492 B1 | 3/2001 | Ohsaki |
| 6,213,442 B1 | 4/2001 | Ivers |
| 6,336,794 B1 | 1/2002 | Kim |
| 6,375,147 B1 | 4/2002 | Radziun et al. |
| 6,433,550 B1 | 8/2002 | Kinanen |
| 6,628,117 B2 | 9/2003 | Ham |
| 6,677,753 B1 * | 1/2004 | Danby et al. ............... 324/318 |
| 6,739,568 B2 | 5/2004 | Whittaker et al. |
| 2002/0190827 A1 * | 12/2002 | Aoki et al. ............... 335/299 |
| 2003/0020578 A1 | 1/2003 | Aoki et al. |
| 2003/0179060 A1 | 9/2003 | Wang et al. |

OTHER PUBLICATIONS

WEBSITE:www.techmfg.com, page entitled: "Gimbal Piston Isolators," Aug. 23, 2001.

WEBSITE:www.techmfg., page entitled: "MaxDamp™—Vibration Isolation System," Aug. 23, 2001.

* cited by examiner

HIGH FIELD OPEN MRI MAGNET ISOLATION SYSTEM AND METHOD

BACKGROUND OF INVENTION

The present invention relates generally to a magnetic resonance imaging (MRI) system, and more particularly to an open MRI magnet system having a vibration isolation system.

MRI magnets include resistive and superconductive MRI magnets used in various applications, such as medical diagnostics. Known superconductive MRI magnets include liquid-helium-cooled, cryocooler-cooled, and hybrid-cooled superconductive magnets. Typically, the superconductive coil assembly includes a superconductive main coil surrounded by a thermal shield surrounded by a vacuum enclosure. A cryocooler-cooled MRI magnet typically also includes a cryocooler coldhead externally mounted to the vacuum enclosure, having its first stage in solid conduction thermal contact with the thermal shield, and having its second stage in solid conduction thermal contact with the superconductive main coil. A liquid-helium-cooled MRI magnet typically also includes a liquid-helium vessel surrounding the superconductive main coil with the thermal shield surrounding the liquid-helium vessel. A hybrid-cooled MRI magnet uses both liquid helium (or other liquid or gaseous cryogen) and a cryocooler coldhead, and includes designs wherein the first stage of the cryocooler coldhead is in solid conduction thermal contact with the thermal shield and wherein the second stage of the cryocooler coldhead penetrates the liquid-helium vessel to recondense "boiled-off" helium.

Known resistive and superconductive MRI magnet designs include closed MRI magnets and open MRI magnets. Closed MRI magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the MRI magnet's bore where the object to be imaged is placed.

Open MRI magnets, including "C" shape and support-post MRI magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed MRI magnet design.

It is also known in open MRI magnet designs to place an iron pole piece in the bore of a resistive or superconductive coil assembly. The iron pole piece enhances the strength of the magnetic field and, by shaping the surface of the pole piece, magnetically shims the magnet improving the homogeneity of the magnetic field. Nonmagnetizable support posts are connected to the face of the pole pieces. It is additionally known in horizontally-aligned open MRI magnets to support the magnet on the floor using two spaced-apart feet attached to each assembly, such feet raising the assemblies to provide room underneath the assemblies for necessary wires, pipes, etc.

The sharpness of an MRI image depends, in part, on the magnetic field in the imaging volume being time-constant and highly uniform. However, the magnetic field in prior art systems suffers time and spatial deformation caused by vibrations from environmental disturbances. Minor relative motions between any of the magnetic elements will cause significant magnetic field disturbances, thus reducing the image quality.

SUMMARY OF INVENTION

In accordance with one preferred aspect of the present invention, there is an open MRI system, comprising an open MRI magnet system, and a vibration isolation system adapted to support the MRI magnet system.

In accordance with another preferred aspect of the present invention, there is provided an open MRI system comprising a first and a second assembly. Each assembly comprises a longitudinally-extending and generally-vertically-aligned axis, at least one superconductive main coil positioned around the axis and carrying a main electric current in a first direction, and a vacuum enclosure enclosing said at least one superconductive main coil. The system further comprises at least one support beam external to the vacuum enclosures, having a first end attached to said first assembly and having a second end attached to said second assembly. The system further comprises a vibration isolation system.

In accordance with another preferred aspect of the present invention, there is provided a method of installing an open MRI system, comprising measuring environmental disturbances and vibrations at a first site, and providing the open MRI system which comprises a vibration isolation system and an open magnet system. The method further comprises selecting the vibration isolation system based on the measuring step, and installing the MRI system at the first site.

In accordance with another preferred aspect of the present invention, there is provided a method of retrofitting a preexisting open MRI system comprising attaching a vibration isolation system to the magnet system of the preexisting MRI system.

DETAILED DESCRIPTION

The present inventors have realized that all sites containing an MRI system are subject to some kind of environmental disturbance, such as from electrical or mechanical equipment installed within the same building. The environmental disturbances or vibrations excite the MRI system magnets through the MRI system's attachment to the building, such as through the floor, walls or ceiling of a room of a building containing the MRI system. The most significant such attachment is the foot support, which is fastened to the floor to secure the magnets of the MRI system. The foot support transmits the environmental disturbances and vibrations to the magnets of the MRI system, thus degrading the image quality.

The present inventors have determined that by using a tunable vibration isolation system instead of conventional feet or other rigid support structures found on horizontally-aligned open MRI magnets, allows the natural frequency of the MRI magnets to be shifted to a site defined value. This allows the natural frequency of the MRI magnets to be set at a value at which the sensitivity of the magnets to vibration at the dominant frequencies imparted to the magnets by environmental disturbances is reduced or minimized. If desired, an optional adjustable balance mass may be used in combination with the vibration isolation system to improve the gravity stability of the vibration isolation system when pneumatic isolators are used.

The vibration isolation system is particularly advantageous when used with in a vertically-aligned open MRI magnet system arranged in a "clam-shell" configuration. The superconductive coils of the magnet assemblies of such MRI systems are especially subject to vibrations from the environment because the magnet assemblies are attached by only two support members, especially when the two support members are not diametrically aligned to the diameter line of the magnet assemblies. Such clam-shell support is a very open support, providing ease of patient table access to the imaging volume and providing ease of patient positioning within the imaging volume. Engineering analysis shows that the vibration isolation system reduces magnet vibrations in a vertically-aligned open MRI magnet having a "clam-shell" configuration. However, the isolation system may be used for MRI systems having a configuration other than a "clam-shell" configuration, if desired.

The vibration isolation system is also advantageous because it is fairly inexpensive. The isolation system may utilize commercially available isolators which are configured to support a new MRI magnet system or retrofitted to an preexisting MRI magnet system.

Figure 1:
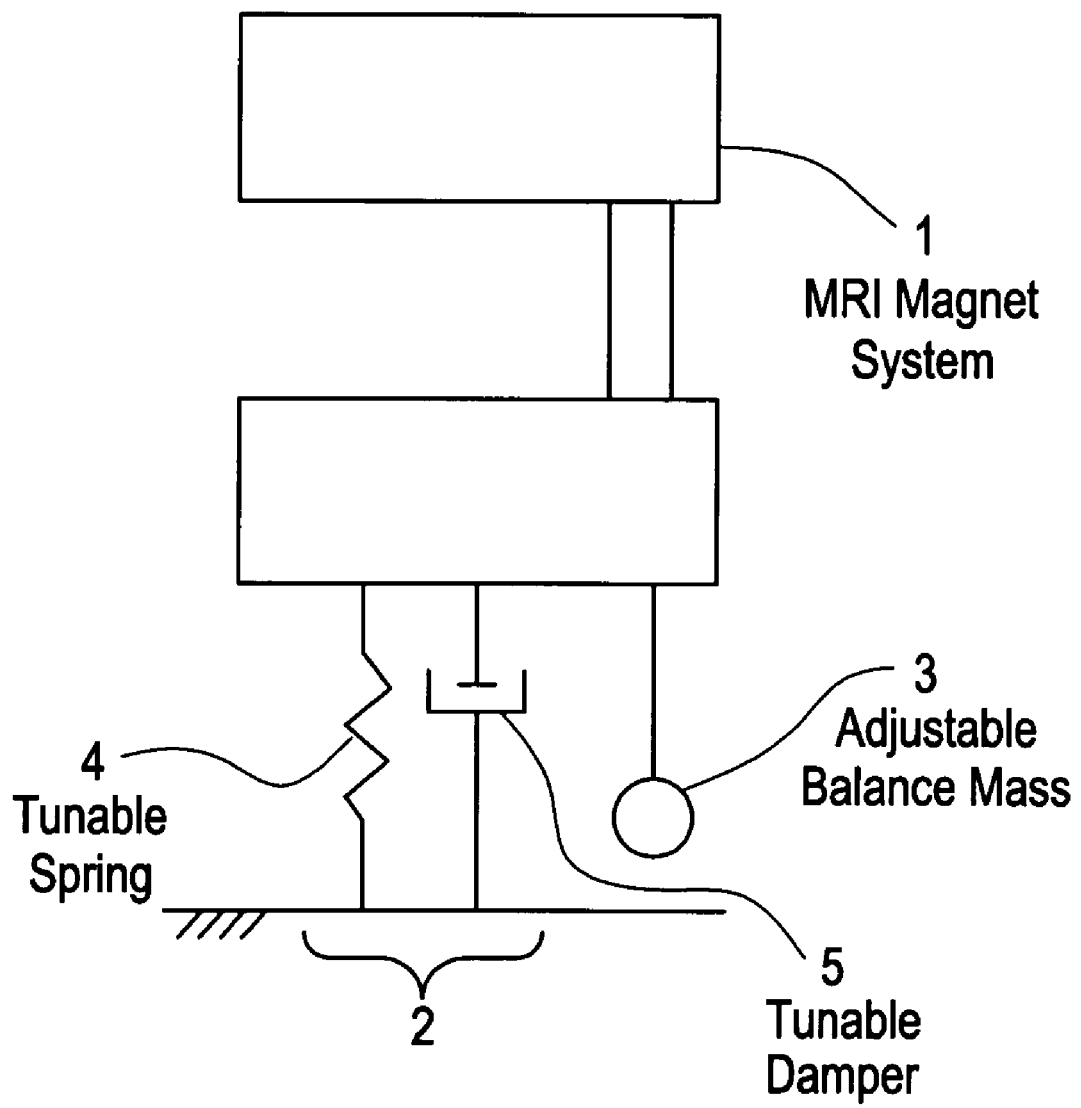
FIGS. 1–6 are schematic side cross sectional views of portions of an MRI system according to the preferred embodiments of the present invention. In the drawings, the same numerals represent the same elements throughout.

FIG. 1 conceptually shows components of an isolation system for an MRI system 1 arranged in a "clam-shell" configuration according to a preferred aspect of the present invention. The isolation system is made up of a vibration isolation system 2 and an optional, adjustable balance mass 3. The vibration isolation system 2 includes a conceptual variable spring element 4 and a conceptual variable damper element 5. The spring element 4 and the damping element 5 may integrated into the same device or they may comprise different devices (i.e., in this case, the system 2 comprises two discrete devices). It should be noted that any or all of these conceptual elements 3, 4 and 5 should be broadly construed and include many elements which have similar performance characteristics. For example, the spring element 4 includes mechanical springs, air isolators, piezoelectric actuator isolators, elastic webbing or other devices which provide frequency isolation.

Figure 2:
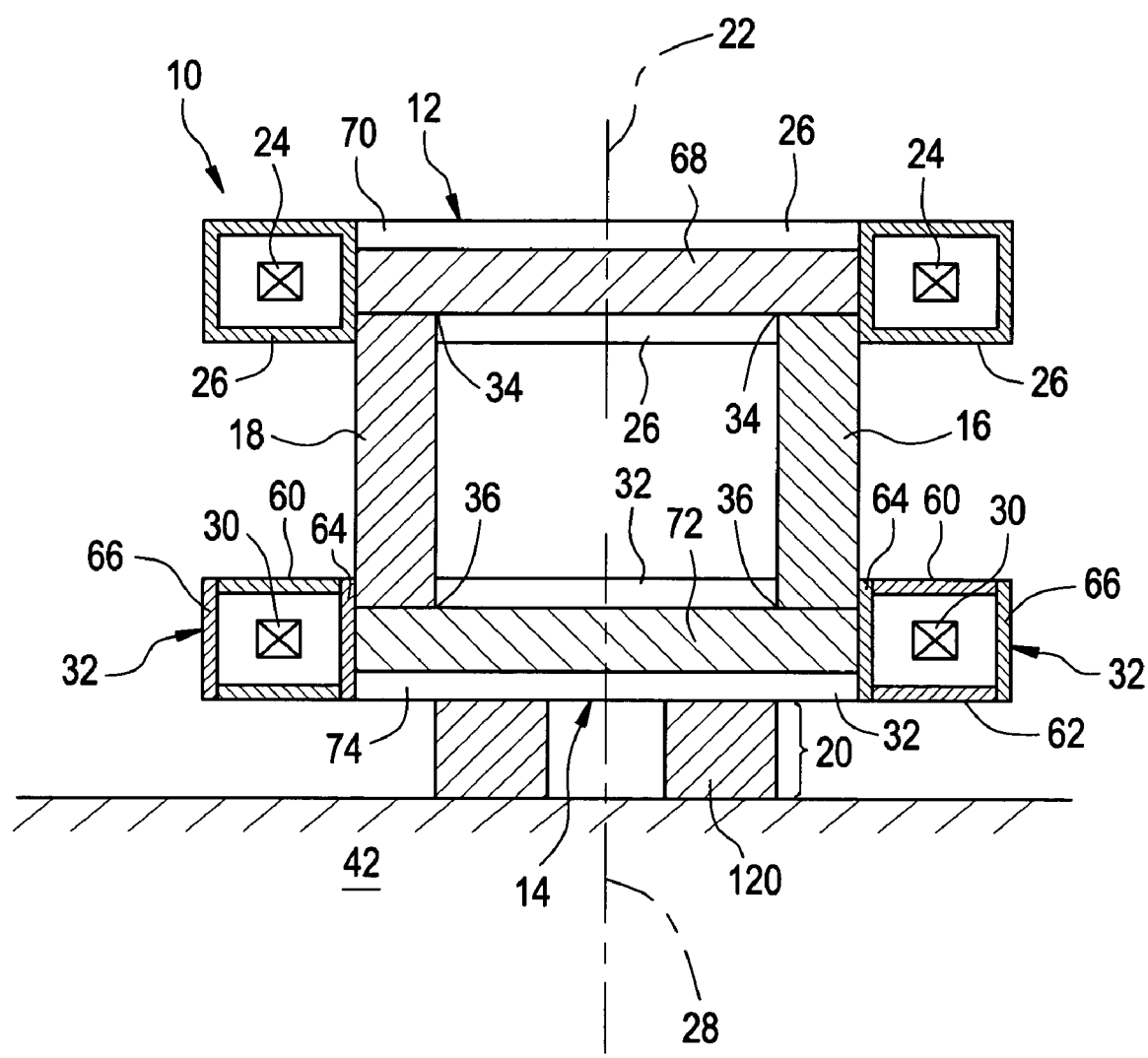

FIG. 2 illustrates a portion of an MRI system according to the first embodiment of the present invention. The MRI system includes an open MRI magnet system 10, which contains a first magnet assembly 12, a second magnet assembly 14 and at least one support member (such as the two support beams 16 and 18 that are shown in FIG. 2), and a vibration isolation system 20. However, more than two support beams or other types of support members (i.e., "C" shaped supports) may be provided. Additional parts of the MRI system, such as the control electronics and cooling fluid supply pipes, are not shown in FIG. 2 for clarity.

The first assembly 12 has a longitudinally-extending and generally-vertically-aligned first axis 22, at least one superconductive main coil 24, and a first vacuum enclosure 26. By "generally-vertically-aligned" is meant vertically aligned plus or minus twenty degrees. The at least one superconductive main coil 24 of the first assembly 12 is generally coaxially aligned with the first axis 22 and carries a first main electric current in a first direction. The first direction is defined to be either a clockwise or a counterclockwise circumferential direction about the first axis 22 with any slight longitudinal component of current direction being ignored. The first vacuum enclosure 26 encloses at least one superconductive main coil 24 of the first assembly 12 and preferably surrounds a first bore 70. A first magnet pole piece 68 is generally coaxially aligned with the first axis 22, is disposed inside the first bore 70 and outside the first vacuum enclosure 26, and is attached to the first vacuum enclosure 26.

The second assembly 14 is longitudinally spaced apart from and disposed generally vertically below the first assembly 12. The second assembly 14 has a longitudinally-extending second axis 28, at least one superconductive main coil 30, and a second vacuum enclosure 32. The second axis 28 is generally coaxially aligned with the first axis 22. At least one superconductive main coil 30 of the second assembly 14 is generally coaxially aligned with the second axis 28 and carries a second main electric current in the previously-described first direction. The second vacuum enclosure 32 encloses the at least one superconductive main coil 30 of the second assembly 14 and preferably surrounds a second bore 74. A second magnet pole piece 72 is generally coaxially aligned with the second axis 28, is disposed inside the second bore 74 and outside the second vacuum enclosure 32, and is attached to the second vacuum enclosure 32. The vacuum enclosure 32 contains generally horizontally-aligned annular shaped walls 60 and 62 and circumferentially-extending walls 64 and 66. Walls 60, 62, 64 and 66 enclose the coil 30.

At least one support member, such as the support beams 16 and 18, has a first end 34 attached to the first assembly 12 and has a second end 36 attached to the second assembly 14. Each support beam or member is preferably made of a nonmagnetizable material or includes at least a nonmagnetizable material portion which blocks having a magnetizable path between its ends. Such nonmagnetizable material has a relative permeability of generally unity. Examples of nonmagnetizable materials include aluminum, copper, nonmagnetic stainless steel, plastic, wood, etc.

The vibration isolation system 20 of the embodiment of FIG. 2 contains of one or more isolators 120 positioned beneath the second (i.e., lower) assembly 14. In this embodiment, the isolators 120 can be either passive or active isolators. For example, passive pneumatic isolators, such as Gimbal Piston or MaxDamp®, or active isolators, such as STACIS® 2000 or 3000 Active Piezoelectric Vibration Control System units may be used. These isolators are made by Technical Manufacturing Corporation (TMC) in Peabody, Mass. (see www.techmfg.com).

The pneumatic isolators work by the pressure in a volume acting on an area of a piston to support the load against the force of gravity. A reinforced rolling rubber diaphragm forms a seal between the air tank and the piston. The pressure in the isolator is controlled by a height control valve which senses the height of the payload, and inflates the isolator until the payload is "floating." Thus, in this case, the isolator assembly 120 acts as a spring element and as a damper.

In the active isolators 120, actively controlled piezoelectric actuators are used to cancel the vibration on the payload (i.e., the MRI magnet system). This system contains an "inner-loop" damping function, in which vibration sensors measure floor noise, which is conditioned and used to cancel vibration, and an "outer-loop" damping function, in which vibration sensors mounted on payload side of the system measure the residual vibration on the payload, which is used in a feed back loop to further reduce vibration. It should be noted that any other commercial off the shelf or custom build isolator can be used instead, providing that it provides the appropriate vibration isolation.

In the embodiment of FIG. 2, the isolators 120 provide the only weight-bearing support for the second assembly 14 (and preferably for the entire magnet system 10). The isolators 120 are positioned with respect to the second axis 28 in such a manner that each isolator bears a desired load. For example, four to twenty, preferably ten isolators 120 may be arranged within the footprint of the second assembly 14 to support the magnet system 10. The isolators 120 are attached to a floor 42 of a building or other support for the MRI system.

In an alternative aspect of the present invention, the vibration isolation system 20 comprises a material which is capable of isolating vibration from the environment. This material, acts as a spring element and as a damper. For example, the vibration isolation system 20 may comprise a rubber mat or rubber blocks placed between the magnet system 10 and the floor 42.

The isolation system 20 may be exposed (i.e., visible below the magnet system 10) or it may be enclosed. Preferably, the isolation system 20 is enclosed by an enclosure (not shown in FIG. 2 for clarity) for aesthetic, sanitary, acoustical reasons. It is desirable to have the isolation system 20 contained within the footprint of the MRI magnet system 10, whether it is enclosed or not enclosed.

Preferably, the vibration isolation system 20 provides an adjustable damping and spring constant. This allows the adjustment of the natural frequency of the MRI magnet system 10 to a site defined region. This can be done both at the manufacturer's facility and at the MRI system installation site. The isolation system 20 is preferably selected such that its damping function minimizes the magnet system Q factor and controls the bandwidth of the vibrational response at the predominant exciting frequencies. Furthermore, the isolation system also preferably provides a sufficiently high damping to improve the gravitational stability of the magnet system. Thus, the isolators 120 are selected such that they can provide the above functions.

Figure 3:
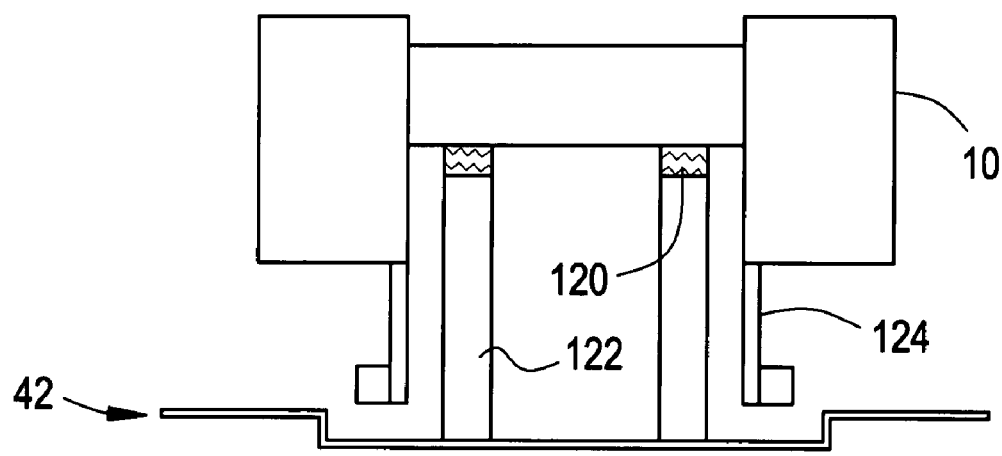

In a second preferred embodiment, the vibration isolation system 20 is used in a retrofit of a preexisting (i.e., a prior art) MRI system, as shown in FIG. 3. A prior art MRI system is ordinarily rigidly attached (i.e., bolted, clamped and/or welded) to a floor of a building by support structure, such as by legs or by a curved skirt 124, as described in U.S. Pat. No. 6,198,371, incorporated herein by reference. In retrofitting the MRI system, in order to decrease the retrofitting costs, after the MRI system is detached from the floor (i.e., unbolted, unclamped, etc), the support legs or skirt 124 are not removed from the MRI system. Thus, instead of removing the existing supports, the vibration isolation system 20 can be colocated with the supports. All that is necessary is to raise the height of the MRI magnet assembly 10 so that the bottom of the preexisting support structure does not contact the floor 42 of the building. As shown in FIG. 3, posts 122 or other load bearing objects are placed under the isolators 120 to elevate the MRI magnet assembly 10 to a height sufficient to prevent the support legs or skirt from contacting the building floor 42.

Figure 4:
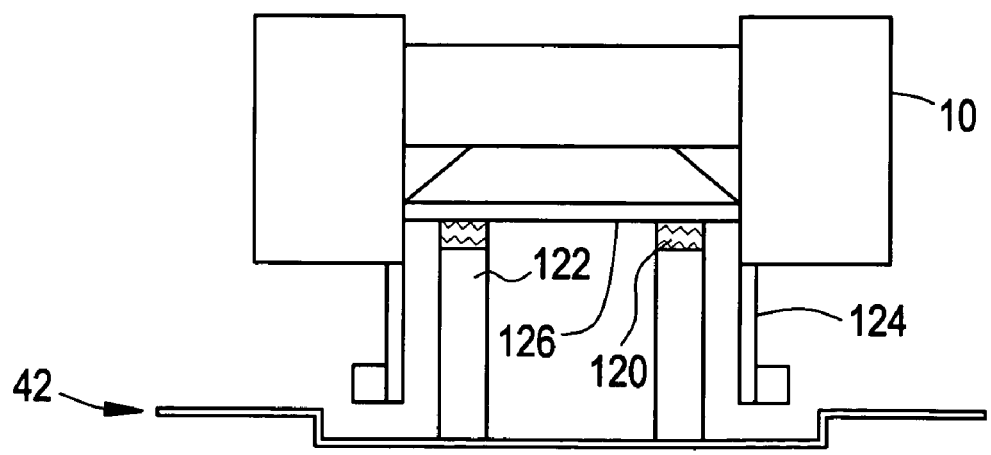

In a third preferred embodiment of the present invention, an optional structural holder 126 is located between the isolators 120 and the lower assembly 14 of the magnet system 10, as shown in FIG. 4. The holder 126 may be one or more a metal or other plates which are placed between the isolators 120 and the lower assembly 14. The holder is preferably lightweight, compact in size and provides a level surface for the isolators 120. The holder 126 is advantageous when the lower surface of the second assembly 14 is not sufficiently level or does not have a desired shape or material to allow the isolators 120 to be connected directly to the second assembly. Thus, the holder 126 may be particularly advantageous for retrofitting a preexisting MRI system, where the second assembly 14 was not designed to be directly connected to the isolators 120.

Figure 5:
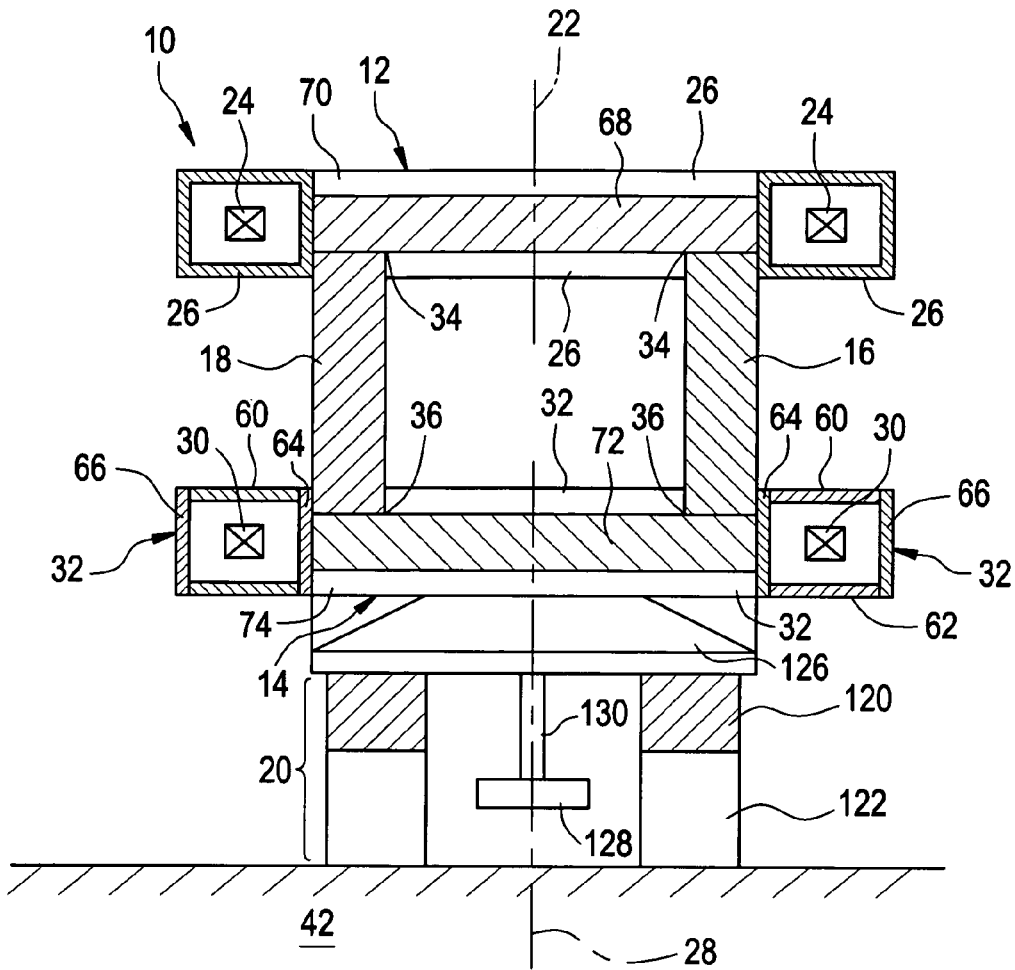

In a fourth preferred embodiment of the present invention, a balance mass 128 is added to the isolation system 20, as shown in FIG. 5. In this embodiment, the balance mass 128 is supported by a balance mass support 130 that is connected the structural holder 126. Alternatively, the balance mass 128 can be connected directly to the structural holder 126, or directly to the lower assembly 14 of the magnet system if the holder 126 is omitted. The balance mass 128 may be any heavy object, such as metal or ceramic bars or weights. Preferably, the optional posts 122 are also used in combination with the balance mass 128 to raise the isolators off the floor 42 to provide sufficient clearance for the placement of the balance mass, as shown in FIG. 5.

The balance mass 128 is preferably adjustable to allow the center of gravity of the magnet assembly 10 to be changed to improve gravitational stability. The balance mass 128 may be adjusted by raising or lowering it with respect to the magnet system 10. The adjustments may be made, for example, by manually (i.e., by using a jackscrew or similar elements), electrically or hydraulically raising or lowering the support 130. Alternatively, the adjustments may be made by adding or removing mass from the balance mass 128. For example, one or more weight providing plates may be added or removed from the balance mass for adjustment. Most preferably, the balance mass 128 is adjustable on site (i.e., in the building that will house the MRI system), after the environmental vibrations at this site have been determined.

A structure supported below its center of mass is inherently unstable because as the structure tilts, its center of mass moves horizontally in a way that wants to further increase the tilt. The maximum allowed height of the magnet system center of mass improves with the square of the isolator 120 separation, and the stiffness of the isolators 120. The balance mass 128 lowers the center of mass of the structure to improve the gravitational stability of the structure. Supporting the magnet system 10 closer to its center of mass will reduce the rocking of the magnet system 10 and thus improve the MRI image. The balance mass 128 can be configured in such a way as to work with the isolators to change the system natural frequency and reduce the magnitude of the vibrations experienced by the magnet system 10.

Figure 6:
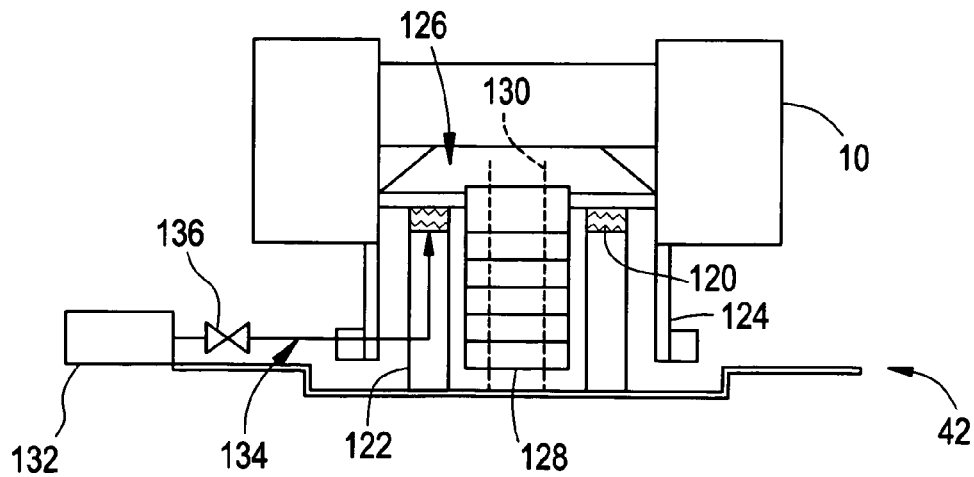

The fifth embodiment of the present invention is illustrated in FIG. 6, where the balance mass 128 is used with pneumatic (i.e., air) isolators 120. The isolators 120 are supplied with air (or another gas) from an air source 132 through a line 134. A height control valve 136 is also provided to control the flow of air through the line 134 to control the pressure in the isolators 120. The valve 136 may be manually or computer controlled. FIG. 6 also shows an alternative configuration of the isolation system 20, where the optional balance mass 128 is connected directly to the structural holder 126, and the balance mass support is omitted.

The MRI system may be installed at a particular site as follows. The environmental disturbances and vibrations at a particular site are measured. The measurements are preferably made before the MRI system is installed at a particular site.

Then, based on the measurements, the isolators are selected such that the natural frequency of the MRI magnet system and the damping of the isolators will provide significant reduction on ground vibration transmissibility over the entire frequency band. A high damping isolator system is preferably selected when low frequency excitation (i.e., vibrations or disturbances) is significant at the particular site. A low damping isolator system is preferably selected if the particular site has only high frequency disturbances or vibrations.

Furthermore, the damping of the isolators is adjusted to minimize the magnet system Q factor and control the bandwidth of the vibrational response of the magnet system at the predominant exciting frequencies. If a balance mass 128 is present, then the balance mass is adjusted to optimize the center of gravity of the system and the natural frequency of the MRI magnets. Thus, the frequency and damping are site tunable because they are adjusted to be optimized for a particular site. The adjustments may be made before or after the MRI system has been installed at a particular site (i.e., attached to a floor 42 of the building that houses the MRI system).

It should be noted that additional gradient coils, superconductive main coils, superconductive shielding coils, superconductive correction coils, and magnetizable rings may be present, as is known to the artisan, but such coils and rings have been omitted from the figures for clarity. Likewise, coil forms (if needed) to support the superconductive main coils and spacers to position a thermal shield with respect to a cryogenic vessel and to position a thermal shield with respect to a vacuum enclosure have been omitted from the figures for clarity but are well known to those skilled in the art.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

The invention claimed is:

1. An open MRI system, comprising:
an open MRI magnet system; and
a vibration isolation system supporting the MRI magnet system;
wherein:
the vibration isolation system is secured to a floor and the MRI magnet system is attached over the vibration isolation system; and
the vibration isolation system is configured within a footprint of magnets of the MRI magnet system.

2. The open MRI system of claim 1, wherein:
a spring constant and damping of the vibration isolation system are adjustable;
the vibration isolation system is site tunable; and
the vibration isolation system is tuned to minimize the magnet system Q factor and to control a bandwidth of the MRI magnet system vibration response at a predominant MRI magnet exciting frequencies.

3. The open MRI system of claim 1, wherein the vibration isolation system comprises a plurality of pneumatic isolators.

4. The open MRI system of claim 1, wherein the vibration isolation system comprises a plurality of active vibration control isolators.

5. The open MRI system of claim 1, wherein the vibration isolation system comprises:

a plurality of posts secured to the floor; and
a plurality of vibration isolators mounted on the plurality of posts and supporting the MRI magnet system.

6. The open MRI system of claim 5, further comprising an adjustable balance mass located below the MRI magnet system and between the plurality of posts.

7. The open MRI system of claim 1, further comprising a structural holder positioned between the vibration isolation system and the MRI magnet system.

8. The open MRI system of claim 1, wherein the vibration isolation system is retrofitted to a preexisting MRI magnet system.

9. The open MRI system of claim 1, wherein the open magnet system comprises:
(a) a first assembly comprising:
 (1) a longitudinally-extending and generally-vertically-aligned first axis;
 (2) at least one superconductive main coil positioned around said first axis and carrying a first main electric current in a first direction; and
 (3) a first vacuum enclosure enclosing said at least one superconductive main coil of said first assembly;
(b) a second assembly longitudinally spaced apart from and disposed below said first assembly, comprising:
 (1) a longitudinally-extending second axis generally coaxially aligned with said first axis;
 (2) at least one superconductive main coil positioned around said second axis and carrying a second main electric current in said first direction; and
 (3) a second vacuum enclosure enclosing said at least one superconductive main coil of second assembly; and
(c) at least one support beam external to said first and second vacuum enclosures having a first end attached to said first assembly and having a second end attached to said second assembly.

10. An open MRI system, comprising:
an open MRI magnet system;
a vibration isolation system supporting the MRI magnet system; and
a balance mass located below the MRI magnet system.

11. The open MRI system of claim 10, wherein:
a spring constant and damping of the vibration isolation system are adjustable;
the vibration isolation system is site tunable; and
the vibration isolation system is tuned to minimize the magnet system Q factor and to control a bandwidth of the MRI magnet system vibration response at a predominant MRI magnet exciting frequencies.

12. The open MRI system of claim 10, wherein the vibration isolation system comprises a plurality of pneumatic isolators.

13. The open MRI system of claim 10, wherein the vibration isolation system comprises a plurality of active vibration control isolators.

14. The open MRI system of claim 10, wherein the balance mass is adjustable.

15. The open MRI system of claim 10, wherein:
the vibration isolation system is secured to a floor and the MRI magnet system is attached over the vibration isolation system; and
the vibration isolation system is configured within a footprint of the MRI magnet system.

16. The open MRI system of claim 15, wherein the vibration isolation system comprises:

a plurality of posts secured to the floor, such that the balance mass is located between the plurality of posts; and a plurality of vibration isolators mounted on the plurality of posts and supporting the MRI magnet system.

17. The open MRI system of claim 10, wherein the vibration isolation system is retrofitted to a preexisting MRI magnet system.

18. The open MRI system of claim 10, wherein the open MRI magnet system comprises:
 (a) a first assembly comprising:
  (1) a longitudinally-extending and generally-vertically-aligned first axis;
  (2) at least one superconductive main coil positioned around said first axis and carrying a first main electric current in a first direction; and
  (3) a first vacuum enclosure enclosing said at least one superconductive main coil of said first assembly;
 (b) a second assembly longitudinally spaced apart from and disposed below said first assembly, comprising:
  (1) a longitudinally-extending second axis generally coaxially aligned with said first axis;
  (2) at least one superconductive main coil positioned around said second axis and carrying a second main electric current in said first direction; and
  (3) a second vacuum enclosure enclosing said at least one superconductive main coil of second assembly; and
 (c) at least one support beam external to said first and second vacuum enclosures having a first end attached to said first assembly and having a second end attached to said second assembly.

19. An open MRI system, comprising:
an open MRI magnet system;
a vibration isolation system supporting the MRI magnet system; and
a balance mass located below the MRI magnet system;
wherein:
 the vibration isolation system is secured to a floor and the MRI magnet system is attached over the vibration isolation system; and
 the vibration isolation system is configured within a footprint of the MRI magnet system.

20. The open MRI system of claim 19, wherein:
the balance mass is adjustable; and
the vibration isolation system comprises:
 a plurality of posts secured to the floor, such that the balance mass is located between the plurality of posts; and
 a plurality of vibration isolators mounted on the plurality of posts and supporting the MRI magnet system.

21. An open MRI system, comprising:
an open superconductive MRI magnet system; and
a vibration isolation system supporting the MRI magnet system;
wherein:
a spring constant and damping of the vibration isolation system are adjustable;
the vibration isolation system is site tunable; and
the vibration isolation system is tuned to minimize the magnet system Q factor and to control a bandwidth of the MRI magnet system vibration response at a predominant MRI magnet exciting frequencies.

22. An open MRI system, comprising:
an open superconductive MRI magnet system; and
a vibration isolation system supporting the MRI magnet system;
wherein the vibration isolation system comprises a plurality of active vibration control isolators.

23. The open MRI system of claim 21, further comprising:
a structural holder positioned between the vibration isolation system and the MRI magnet system.

24. The open MRI system of claim 23, wherein the vibration isolation system comprises a plurality of pneumatic isolators.

25. The open MRI system of claim 23, wherein the vibration isolation system comprises:
a plurality of posts secured to the floor; and
a plurality of vibration isolators mounted on the plurality of posts and supporting the MRI magnet system.

26. The open MRI system of claim 25, further comprising an adjustable balance mass located below the MRI magnet system and between the plurality of posts.

27. The open MRI system of claim 23, wherein the vibration isolation system is retrofitted to a preexisting MRI magnet system.

28. The open MRI system of claim 23, wherein the open magnet system comprises:
 (a) a first assembly comprising:
  (1) a longitudinally-extending and generally-vertically-aligned first axis;
  (2) at least one superconductive main coil positioned around said first axis and carrying a first main electric current in a first direction; and
  (3) a first vacuum enclosure enclosing said at least one superconductive main coil of said first assembly;
 (b) a second assembly longitudinally spaced apart from and disposed below said first assembly, comprising:
  (1) a longitudinally-extending second axis generally coaxially aligned with said first axis;
  (2) at least one superconductive main coil positioned around said second axis and carrying a second main electric current in said first direction; and
  (3) a second vacuum enclosure enclosing said at least one superconductive main coil of second assembly;
 (c) at least one support beam external to said first and second vacuum enclosures having a first end attached to said first assembly and having a second end attached to said second assembly.

29. The open MRI system of claim 23, wherein:
the vibration isolation system is secured to a floor and the MRI magnet system is attached over the vibration isolation system; and
the vibration isolation system is configured within a footprint of the MRI magnet system.

30. The open MRI system of claim 23, wherein the vibration isolation system comprises a material which is capable of isolating vibration from the environment.

31. The open MRI system of claim 30, wherein the vibration isolation system comprises a rubber mat or rubber blocks placed between the magnet system and a floor.

32. The open MRI system of claim 23, wherein the magnet system is arranged in a clam-shell configuration.

* * * * *